(12) United States Patent
Kim et al.

(10) Patent No.: US 10,877,515 B2
(45) Date of Patent: Dec. 29, 2020

(54) DISPLAY MODULE AND DISPLAY APPARATUS HAVING THE SAME

(71) Applicant: SAMSUNG ELECTRONICS CO., LTD., Suwon-si (KR)

(72) Inventors: Min Sik Kim, Suwon-si (KR); Myeong Gil Kim, Suwon-si (KR); Woo Sung In, Hwaseong-si (KR); Hyun Jun Jung, Yongin-si (KR); Jong Hee Han, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/645,991

(22) PCT Filed: Sep. 4, 2018

(86) PCT No.: PCT/KR2018/010261
§ 371 (c)(1),
(2) Date: Mar. 10, 2020

(87) PCT Pub. No.: WO2019/050243
PCT Pub. Date: Mar. 14, 2019

(65) Prior Publication Data
US 2020/0201384 A1 Jun. 25, 2020

(30) Foreign Application Priority Data
Sep. 11, 2017 (KR) .................. 10-2017-0115804

(51) Int. Cl.
*G06F 1/16* (2006.01)
*F21V 8/00* (2006.01)
*H05K 7/20* (2006.01)

(52) U.S. Cl.
CPC ......... *G06F 1/1609* (2013.01); *G02B 6/0078* (2013.01); *H05K 7/20963* (2013.01); *G06F 2200/1612* (2013.01)

(58) Field of Classification Search
CPC combination set(s) only.
See application file for complete search history.

(56) References Cited

U.S. PATENT DOCUMENTS

| 8,350,980 B2 * | 1/2013 | Ohashi | G02B 6/0085 349/58 |
| 8,358,387 B2 * | 1/2013 | Choi | G02B 6/0083 349/65 |

(Continued)

FOREIGN PATENT DOCUMENTS

| EP | 2620791 | 7/2013 |
| EP | 2722707 | 4/2014 |

(Continued)

OTHER PUBLICATIONS

Extended European Search Report dated May 20, 2020 from European Application No. 18854664.2, 8 pages.

(Continued)

*Primary Examiner* — Lisa Lea-Edmonds
(74) *Attorney, Agent, or Firm* — Staas & Halsey LLP

(57) ABSTRACT

A display module has a display panel having a long side and a short side and a light guide plate installed adjacent to at least one of the long side and the short side, to guide a light emitted from a light source to the display panel. A bottom chassis is disposed behind the light guide plate, and a guide member to guide the movement of the light source module in accordance with the expansion and contraction of the light guide plate. The guide member guides the light source module to move along one of the long side and the short side on which the light source module is installed.

15 Claims, 16 Drawing Sheets

(56) References Cited

U.S. PATENT DOCUMENTS

| | | | | |
|---|---|---|---|---|
| 8,665,398 | B2* | 3/2014 | Choi | G02B 6/009 349/65 |
| 8,724,049 | B2* | 5/2014 | Jeong | G02F 1/133615 349/60 |
| 8,773,617 | B2* | 7/2014 | Choi | G02B 6/0031 349/65 |
| 8,783,930 | B2* | 7/2014 | Park | G02B 6/0026 362/611 |
| 9,030,642 | B2* | 5/2015 | Huang | G02F 1/133608 349/187 |
| 9,201,189 | B2* | 12/2015 | Lee | G02F 1/1336 |
| 9,447,958 | B2* | 9/2016 | Lee | F21V 29/70 |
| 10,175,530 | B2* | 1/2019 | Jeong | G02F 1/133603 |
| 10,353,142 | B2* | 7/2019 | Conrad | G02B 6/0085 |
| 10,649,255 | B2* | 5/2020 | Kim | G06F 1/1601 |
| 2010/0066939 | A1 | 3/2010 | Ohashi et al. | |
| 2014/0118630 | A1* | 5/2014 | Sasaoka | H04N 5/66 348/790 |
| 2014/0146524 | A1* | 5/2014 | Choi | F21V 29/85 362/97.1 |
| 2014/0184926 | A1* | 7/2014 | Shimomichi | H04N 5/655 348/794 |
| 2014/0293136 | A1* | 10/2014 | Mouri | G02B 6/009 348/725 |
| 2015/0219837 | A1* | 8/2015 | Horiguchi | G02B 6/0088 362/612 |
| 2015/0247967 | A1* | 9/2015 | Horiuchi | G02F 1/133608 362/611 |
| 2015/0285988 | A1* | 10/2015 | Maeyama | G02B 6/0065 362/613 |
| 2015/0373859 | A1* | 12/2015 | Hwang | H05K 5/0217 362/611 |
| 2016/0033711 | A1* | 2/2016 | Lee | F21K 9/64 362/607 |
| 2016/0054518 | A1* | 2/2016 | Uchimi | G02F 1/133308 349/58 |
| 2016/0120043 | A1* | 4/2016 | Kim | B32B 5/26 362/97.1 |
| 2016/0223741 | A1* | 8/2016 | Lee | G02B 6/00 |
| 2016/0238877 | A1* | 8/2016 | Wagner | H05K 9/0054 |
| 2016/0259122 | A1* | 9/2016 | Negoro | G02F 1/13306 |
| 2016/0266299 | A1* | 9/2016 | Yoon | G02B 6/0026 |
| 2017/0045679 | A1* | 2/2017 | Matsumoto | G02F 1/133308 |
| 2017/0212299 | A1 | 7/2017 | Matsui et al. | |
| 2017/0293065 | A1* | 10/2017 | Kim | G02F 1/133504 |
| 2017/0315408 | A1* | 11/2017 | Lee | G02F 1/133611 |
| 2018/0039136 | A1* | 2/2018 | Shim | G02B 6/0088 |
| 2018/0156968 | A1* | 6/2018 | Yoo | G02B 6/009 |
| 2018/0157117 | A1* | 6/2018 | Jeong | G02B 6/0065 |
| 2018/0306971 | A1* | 10/2018 | Conrad | F21S 9/02 |
| 2020/0264473 | A1* | 8/2020 | Aruga | G02B 6/0073 |

FOREIGN PATENT DOCUMENTS

| | | |
|---|---|---|
| EP | 2913708 | 9/2015 |
| KR | 10-0941884 | 2/2010 |
| KR | 10-2014-0044514 | 4/2014 |
| KR | 10-2016-0007902 | 1/2016 |
| KR | 10-2017-0049315 | 5/2017 |

OTHER PUBLICATIONS

International Search Report dated Jan. 4, 2019 from International Application No. PCT/KR2018/010261, 4 pages.

* cited by examiner

DISPLAY MODULE AND DISPLAY APPARATUS HAVING THE SAME

CROSS-REFERENCE TO RELATED APPLICATIONS

This application is a U.S. National Stage Application which claims the benefit under 35 U.S.C. § 371 of International Patent Application No. PCT/KR2018/010261, filed on Sep. 4, 2018, which claims the priority benefit of Korean Patent Application No. 10-2017-0115804, filed on Sep. 11, 2017 in the Korean Patent and Trademark Office, the disclosures of which are hereby incorporated by reference in their entirety.

TECHNICAL FIELD

The present disclosure relates to a display module having an edge-type backlight unit and a display apparatus including the display module.

BACKGROUND ART

A display apparatus is a kind of an output device that visually displays data information such as characters, graphics, and images.

The display apparatus can be classified into a light emitting type using a display panel which emits light by itself such as an LED panel (Light Emitting Diode Panel), and a light receiving type using a display panel which cannot emit light by itself and needs to receive light from a backlight unit, such as a liquid crystal panel.

The backlight unit of the light receiving display apparatus includes a light source module including a light source and a printed circuit board, and various optical members. The backlight unit can be divided into a direct type and an edge type according to the position of the light source. The edge type backlight unit includes a light guide plate (LGP) for guiding light emitted from the light source to a display panel.

Such a light guide plate is generally made of a plastic material such as PMMA because PMMA has excellent light transmittance. However, since the PMMA is sensitive to the thermal environment, the light guide plate can easily thermally expand when the temperature of the display apparatus is raised.

Generally, considering the thermal expansion of the light guide plate, a predetermined gap is provided between the light source and the light guide plate, and light loss occurs until light emitted from the light source enters the light guide plate. As a result, problems may occur such as a decrease in luminance, an increase in power for generating the same luminance, and an increase in heat generation due to the increase in power.

DISCLOSURE

Technical Problem

An aspect of the present disclosure is to disclose a display apparatus capable of minimizing space between a light source and a light guide plate that is left empty considering the extent of thermal expansion of the light guide plate.

Another aspect of the present disclosure is to disclose a display apparatus having a light source module that is movable in accordance with expansion and contraction of a light guide plate so that a distance between a light source and the light guide plate is kept constant.

Another aspect of the present disclosure is to disclose a display apparatus capable of smoothly and accurately moving a light source module while a light guide plate expands or contracts.

Technical Solution

In accordance with one aspect of the present disclosure, a display module includes a display panel having a long side and a short side; a light source module having a printed circuit board and a light source mounted on the printed circuit board, and installed adjacent to at least one of the long side and the short side of the display panel; a light guide plate guiding the light emitted from the light source to the display panel; a bottom chassis disposed behind the light guide plate; a guide member including a head part supporting the front face of the printed circuit board to guide the light source module to move in a direction parallel to one of the long side and the short side where the light source module is installed and prevent the light source module from moving in the Z direction orthogonal to the long side and the short side as the light guide plate expands or contracts; and a spacer member attached to a front surface of the printed circuit board to compensate for the thickness of the head part and having thickness corresponding to or greater than the head part.

The spacer member may be formed with a spacer hole to allow the guide member to pass through the space hole.

The light source module may be installed adjacent to the short side of the display panel, and the guide member may guide the light source module to move in the X direction parallel to the long side and prevents the light source module from moving in the Y direction parallel to the short side.

A guide hole may be formed in the printed circuit board, the guide member may include a neck part disposed in the guide hole, the length of the guide hole in the X direction may be larger than the length of the neck part in the X direction, and the length of the guide hole in the Y direction may correspond to the length of the neck part in the Y direction.

A bottom chassis engagement hole may be formed in the bottom chassis so that the guide member is coupled to the bottom chassis, and the guide member may include a hook part that is elastically deformed between a first shape widened to be supported on the rear surface of the bottom chassis and a second shape narrowed to pass through the bottom chassis engagement hole.

The hook part may include an inner support supported by an inner surface of the bottom chassis engagement hole to prevent the guide member from moving in the X direction parallel to the long side and in the Y direction parallel to the short side.

The hook part may include an outer support supported on a rear surface of the bottom chassis to restrain the guide member from moving in the Z direction with respect to the bottom chassis.

The display module further may include an elastic member configured to elastically support the light source module and a middle mold coupled to a front edge of the bottom chassis, and one end of the elastic member is supported by the printed circuit board and the other end is supported by the bottom chassis or the middle mold.

The elastic member may formed of a rubber material and have a rod shape along the side where the light source module is installed.

One end of the elastic member may be adhered to the printed circuit board and the other end may be adhered to the bottom chassis or the middle mold.

The printed circuit board may include a base part arranged in parallel with the light guide plate, and an extension part extending forward from the base part and having the light source mounted thereon, and the elastic member is supported by the extension part.

The display module may further include a graphite sheet disposed between the light source module and the bottom chassis so as to dissipate heat from the light source module, and a lubricant layer may be provided on the front surface of the graphite sheet so that the frictional force is reduced when the light source module moves.

The display module may further include a graphite sheet disposed between the light source module and the bottom chassis so as to dissipate heat from the light source module, and the graphite sheet may be formed with a sheet through hole through which the guide member passes.

The display module may further include a heat sink disposed between the light source module and the bottom chassis to dissipate heat from the light source module, and the heat sink may be formed with a heat sink through hole through which the guide member passes.

The light source module may be installed adjacent to the long side of the display panel, and the guide member may guide the light source module to move in the Y direction parallel to the short side and prevents the light source module from moving in the X direction parallel to the long side.

The long side may include a first long side at the top and a second long side at the bottom, the light source module may include a first light source module disposed adjacent to the first long side and a second light source module disposed adjacent to the second long side, and the guide member may be provided adjacent to the first long side to guide the movement of the first light source module.

The first light source module may be movable in the Y direction in accordance with expansion and contraction of the light guide plate, and the second light source module may be provided to be fixed regardless of the expansion and contraction of the light guide plate.

In accordance with another aspect of the present disclosure, a display apparatus includes a display module; a cover member receiving the display module; and a support leg provided at the rear or lower portion of the cover member to support the display module, wherein the display module includes a display panel having a long side and a short side; a light source module having a printed circuit board and a light source mounted on the printed circuit board and installed adjacent to at least one of a long side and a short side of the display panel; a light guide plate guiding the light emitted from the light source to the display panel; a guide member including a head part supporting the front face of the printed circuit board to guide the light source module to move in a direction parallel to one of the long side and the short side where the light source module is installed and prevent the light source module from moving in the Z direction orthogonal to the long side and the short side as the light guide plate expands or contracts and a spacer member attached to a front surface of the printed circuit board to compensate for the thickness of the head part and having thickness corresponding to or greater than the head part.

Advantageous Effects

The gap between the light source and the light guide plate may be kept constant regardless of the expansion and contraction of the light guide plate. Accordingly, the distance between the light source and the light guide plate may be minimized, thereby improving the brightness of the display panel, lowering the power consumption of the display apparatus, and reducing heat generation.

It is easy to install and detach the guide member for guiding the movement of the light source module and to make the light source module move smoothly and accurately, so that the reliability of the product may be improved.

MODE FOR INVENTION

Because the embodiments described herein are merely the most preferred embodiments of the present disclosure and are not intended to represent all of the technical ideas of the present disclosure, it should be understood that various equivalents or variations that may be substituted for the same at the time of filing of the application are also included in the scope of the present disclosure.

Hereinafter, preferred embodiments of the present disclosure will be described in detail with reference to the accompanying drawings.

Figure 1:
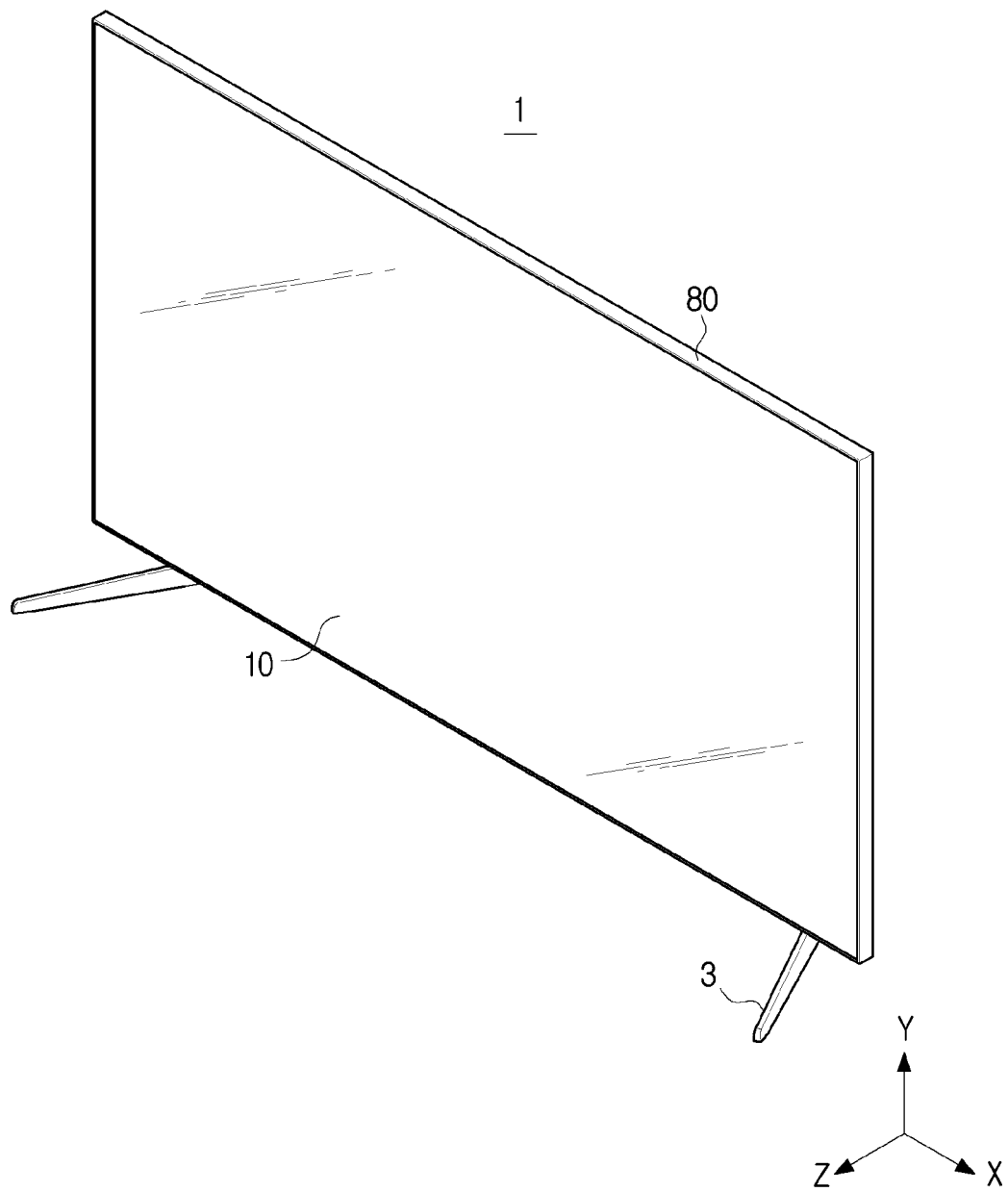
FIG. 1 illustrates a display apparatus according to an embodiment of the present disclosure.
Figure 2:
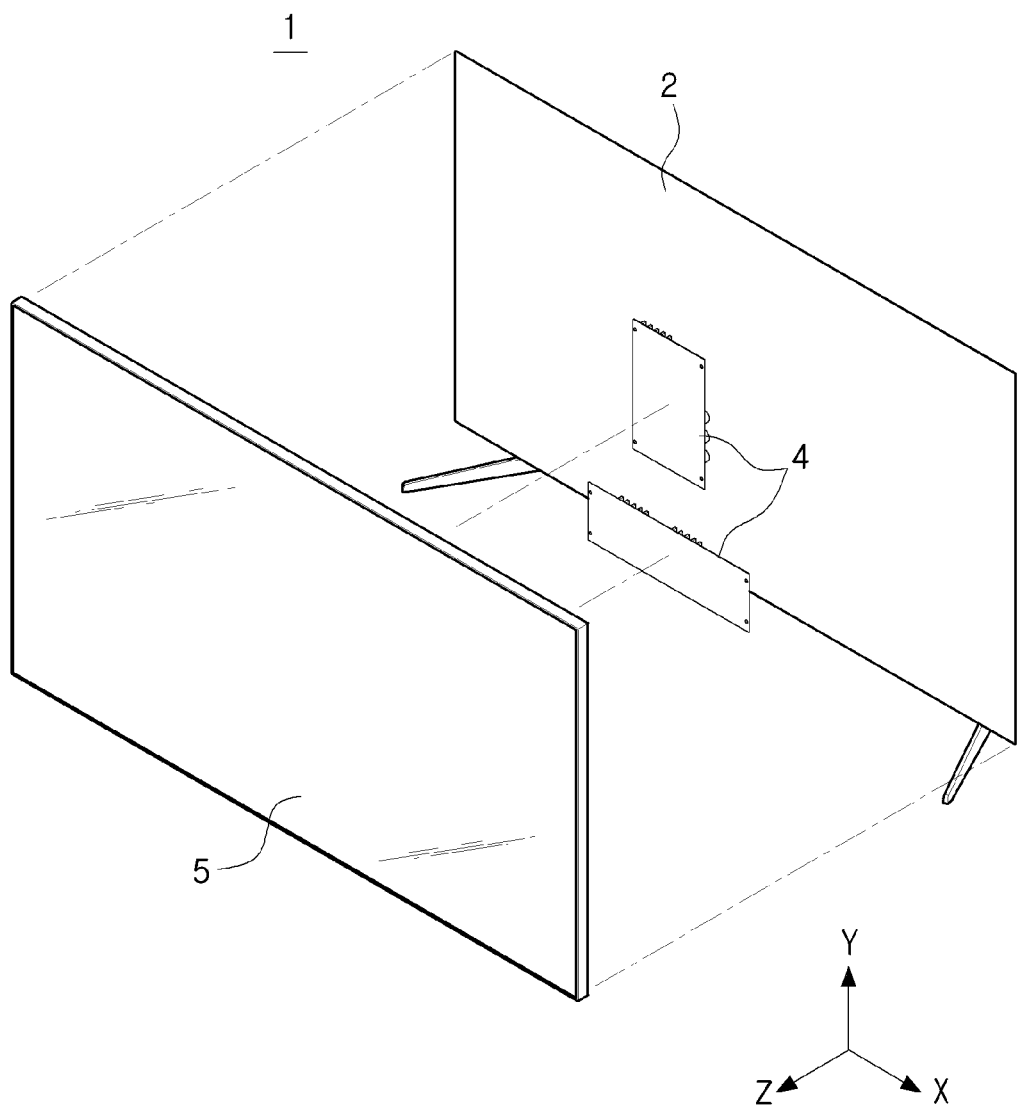
FIG. 2 shows the display apparatus of FIG. 1 broken into a display module and a cover member.
Figure 3:
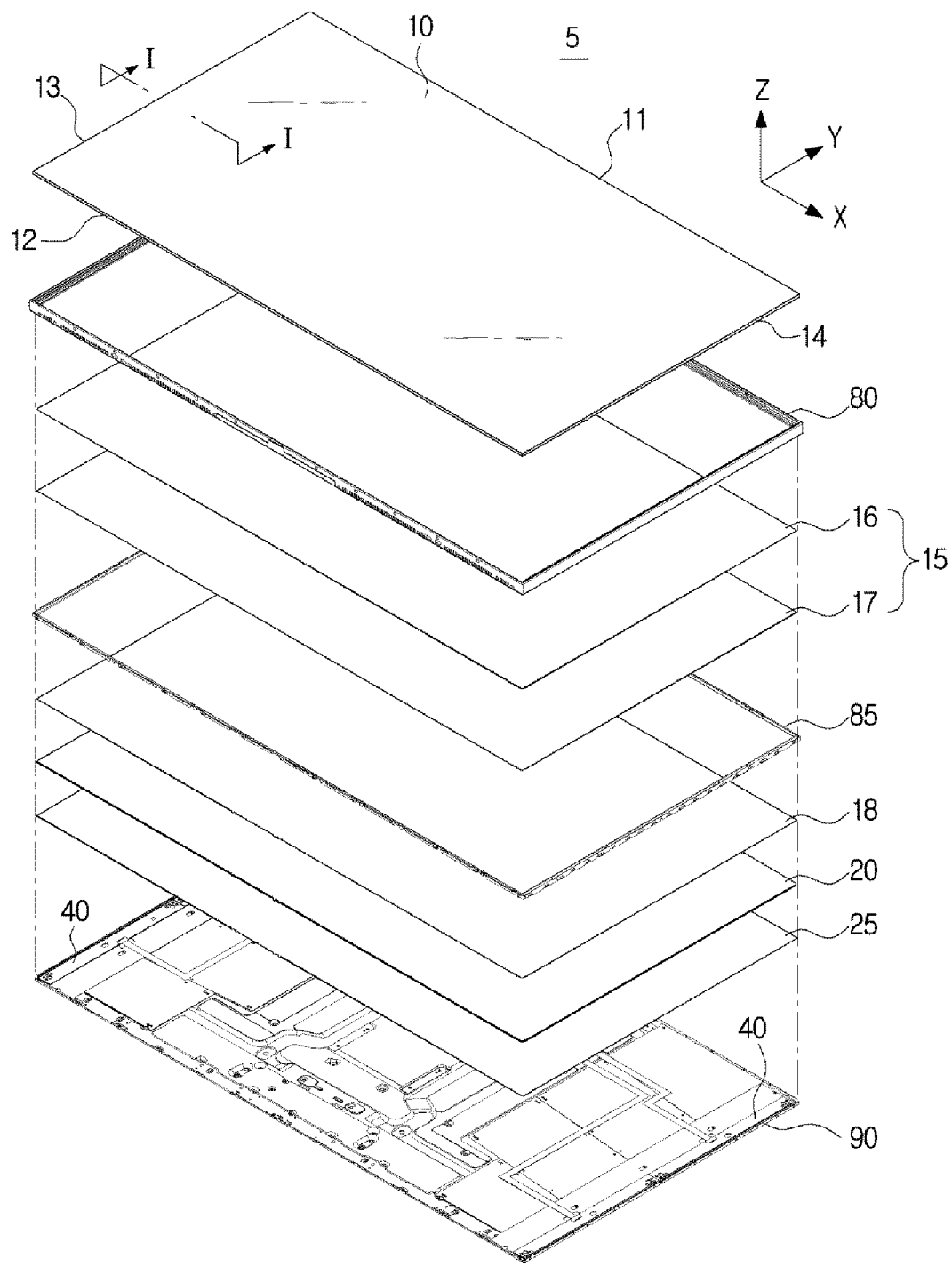
FIG. 3 is an exploded view of a portion of a main configuration of the display module of the display apparatus of FIG. 1.
Figure 4:
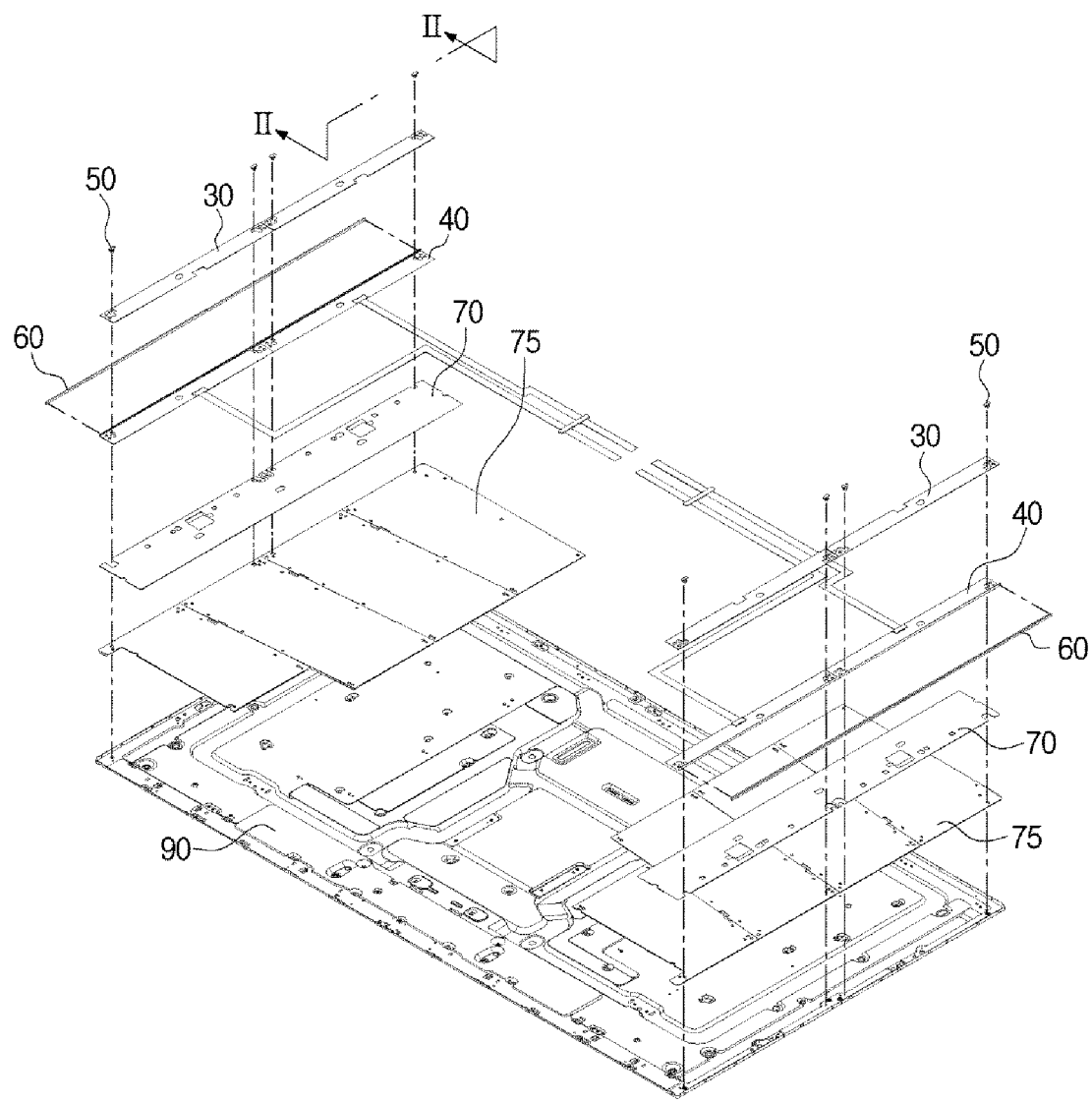
FIG. 4 is an exploded view of the other portion of the main configuration of the display module of the display apparatus of FIG. 1.
Figure 5:
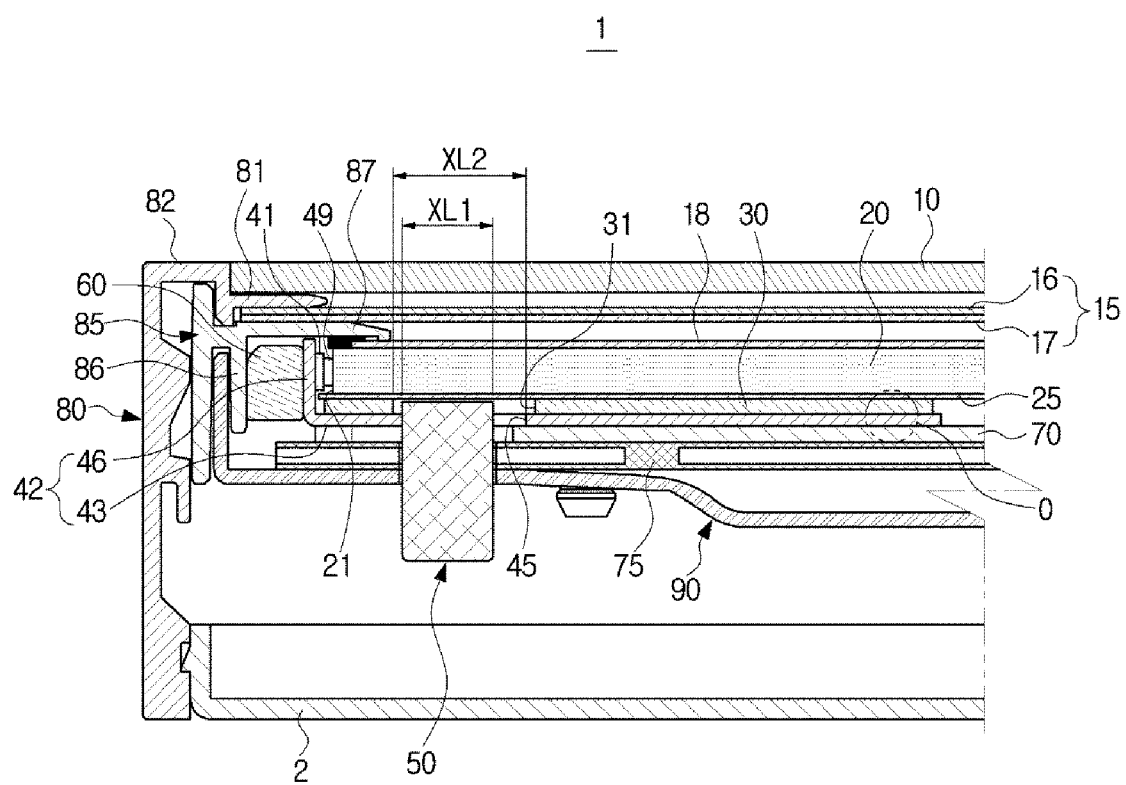
FIG. 5 is a cross-sectional view taken along a line I-I of FIG. 3.
Figure 6:
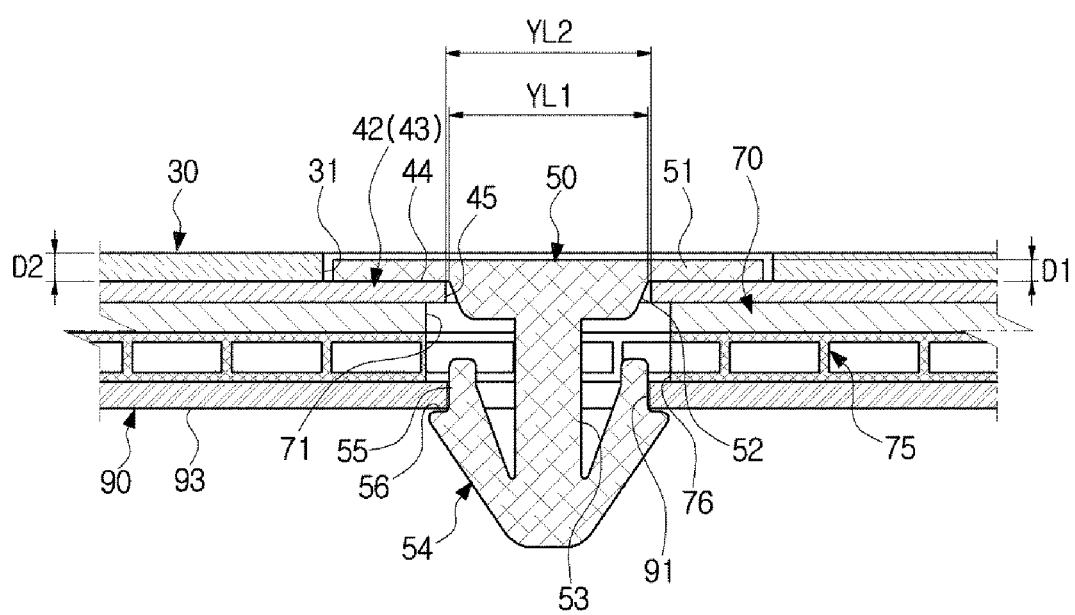
FIG. 6 is a cross-sectional view taken along a line II-II of FIG. 3.
Figure 7:
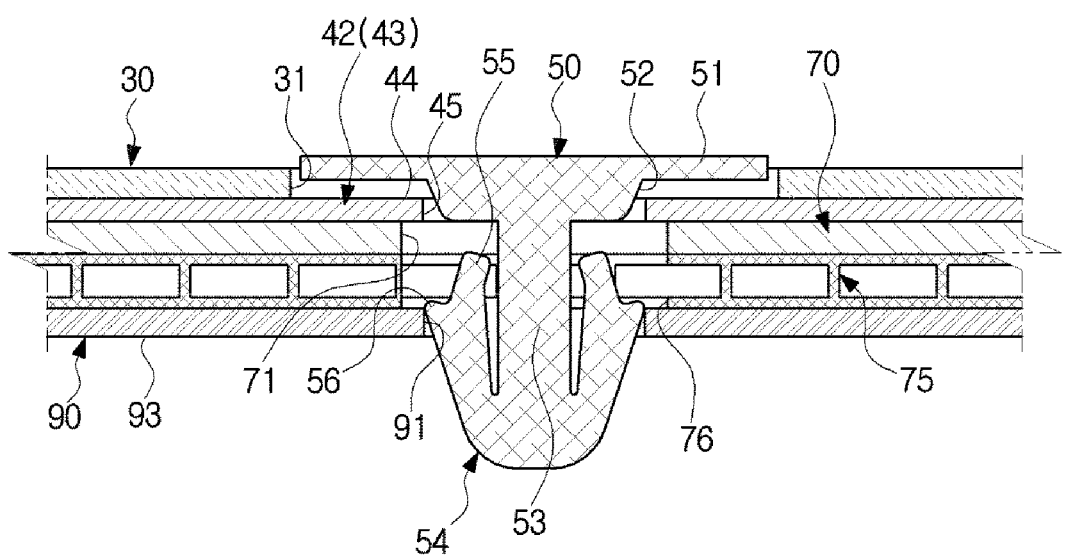
FIG. 7 shows a second shape of a hook part of a guide member of the display apparatus of FIG. 1.
Figure 8:
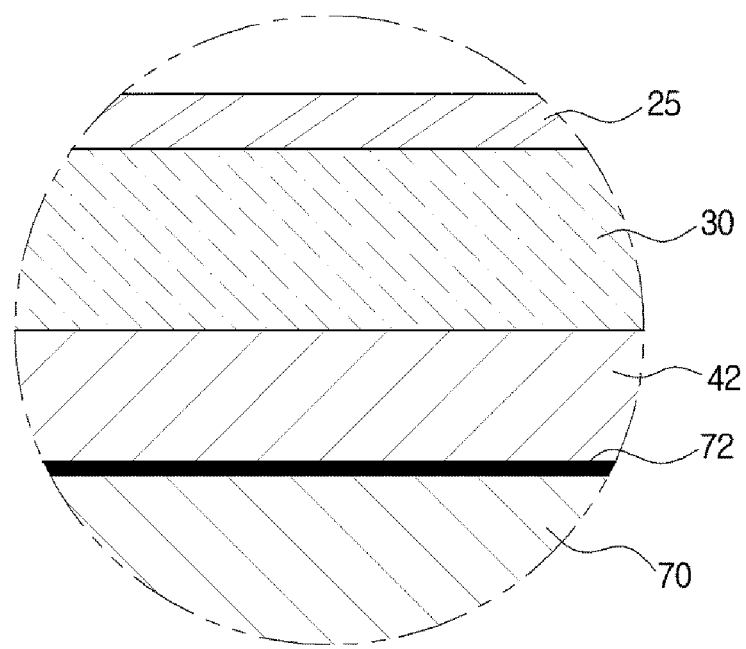
FIG. 8 is an enlarged view of a part 'O' of FIG. 5.
Figure 9:
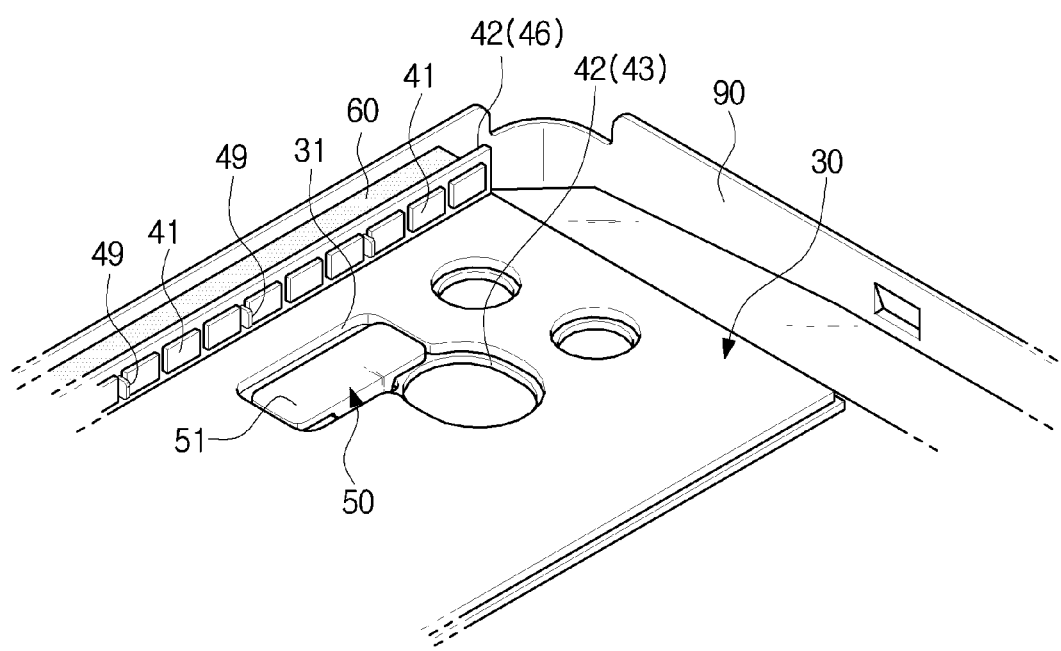
FIG. 9 is an enlarged perspective view of a portion of the display apparatus of FIG. 1.
Figure 10:
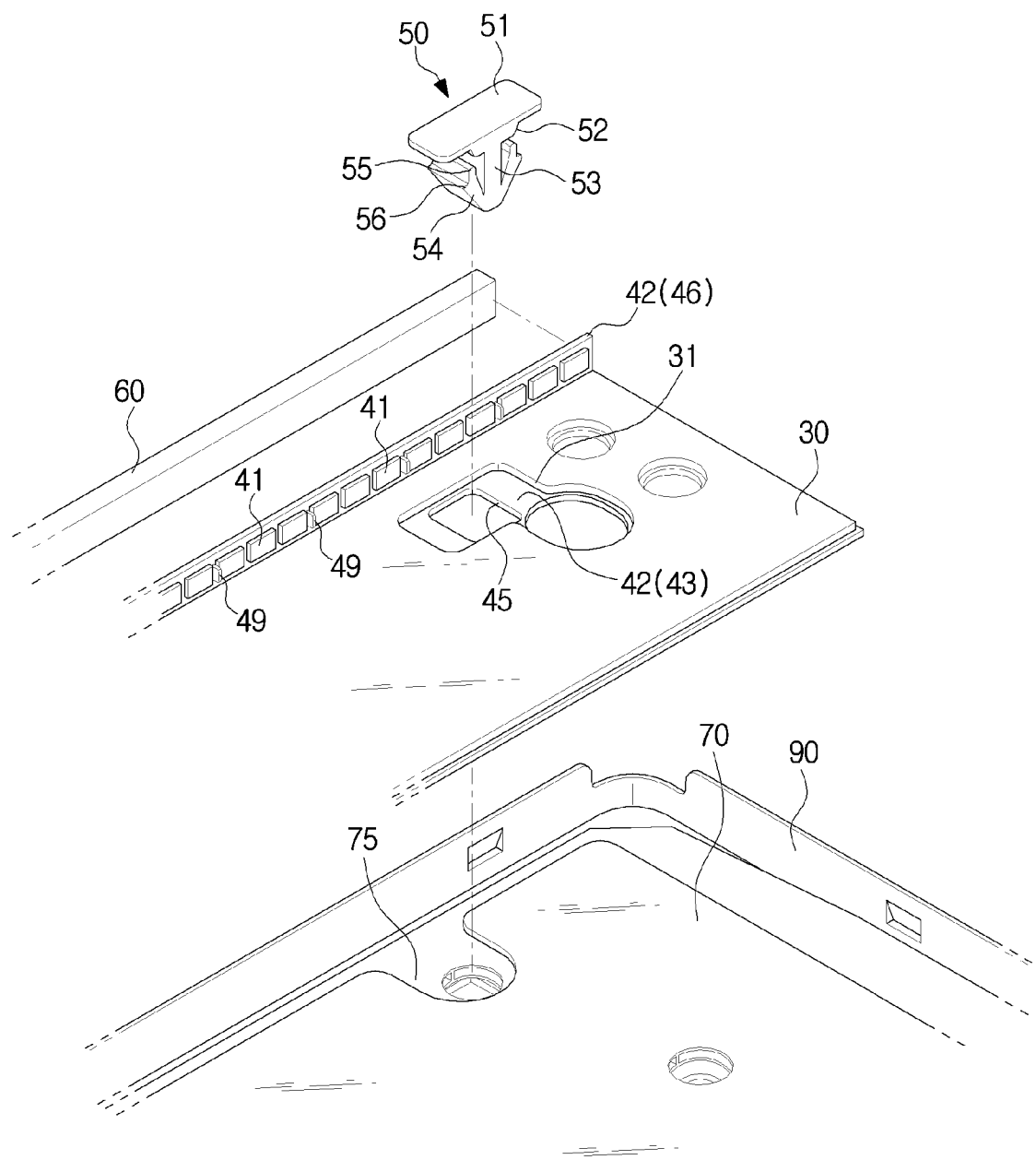
FIG. 10 is an exploded view of the display apparatus shown in FIG. 9.
Figure 11:
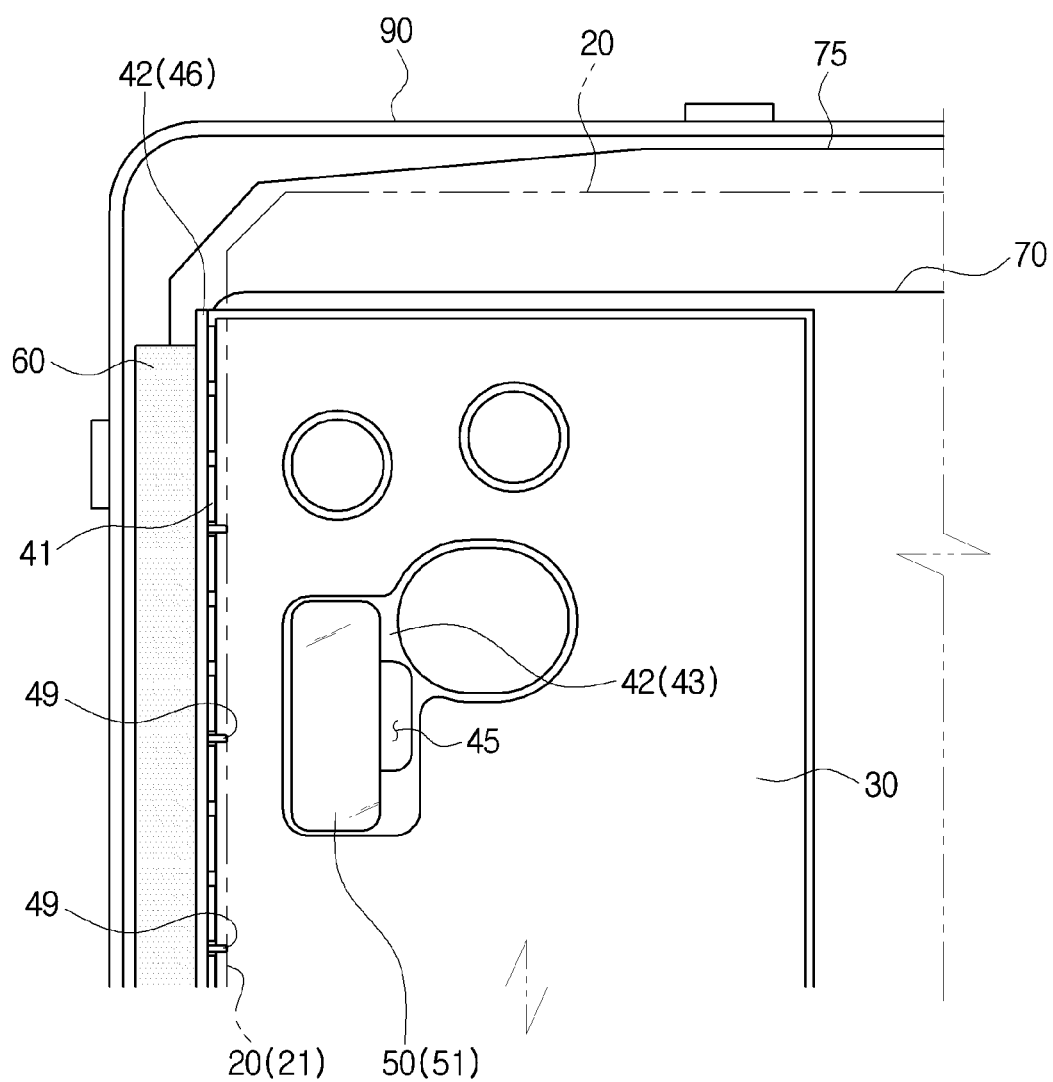
FIG. 11 is a plan view of the display apparatus shown in FIG. 9.

FIG. 1 illustrates a display apparatus according to an embodiment of the present disclosure. FIG. 2 shows the display apparatus of FIG. 1 broken into a display module and a cover member. FIG. 3 is an exploded view of a portion of a main configuration of a display module of the display apparatus of FIG. 1. FIG. 4 is an exploded view of the remaining portion of the main configuration of the display module of the display apparatus of FIG. 1. FIG. 5 is a cross-sectional view taken along a line I-I of FIG. 3. FIG. 6 is a cross-sectional view taken along a line II-II of FIG. 3. FIG. 7 shows a second shape of a hook part of a guide member of the display apparatus of FIG. 1. FIG. 8 is an enlarged view of a part 'O' of FIG. 5. FIG. 9 is an enlarged perspective view of a portion of the display apparatus of FIG. 1. FIG. 10 is an exploded view of the display apparatus shown in FIG. 9. FIG. 11 is a plan view of the display apparatus shown in FIG. 9.

Reference is now made to FIGS. 1-11. The display apparatus 1 is a device for displaying information, materials, data, etc., in the form of characters, graphics, and the like, and includes a television, which is a telecommunication medium for transmitting moving pictures and video signals, and a monitor which is a type of computer output device. The display apparatus 1 may be a flat display apparatus having a flat screen as in the present embodiment, or a curved display apparatus having a curved screen, unlike the present embodiment, or may be a bendable display apparatus having the screen change from being flat to being curved, from curved to flat, or having changeable curvature of the curved surface. The display apparatus 1 may be installed to stand on an indoor or outdoor floor or furniture, or may be installed to be mounted on or inside the wall.

The display apparatus 1 includes a display module 5, a main board 4 to send an electrical signal to the display module 5, and a cover member 2 to accommodate the display module 5 and form the appearance of the display apparatus 1.

The cover member 2 may be provided at the rear of the display module 5 to receive the display module 5. Supporting legs 3 may be provided on the lower or rear side of the cover member 2 so that the display apparatus 1 may stand on the indoor or outdoor floor or furniture. The support legs 3 may be provided separately to join the cover member 2 or be integrally formed with the cover member 2.

The display module 5 includes a display panel 10 to display an image, a backlight unit to provide light on the display panel 10, and a chassis assembly to support the display panel 10 and the backlight unit.

The display panel 10 may display an image using liquid crystals having optical properties depending on changes in voltage and temperature. The display panel 10 may include a thin film transistor (TFT) substrate, a color filter substrate coupled to face the TFT substrate, and liquid crystals injected between the TFT substrate and the color filter substrate.

The backlight unit may be disposed behind the display panel 10 to illuminate the display panel 10. In the present embodiment, the backlight unit may have an edge type in which the light source 41 is disposed on at least one side of a pair of opposite long sides 11 and 12 and a pair of opposite short sides 13 and 14 of the display panel 10.

The backlight unit may include a light source module 40 having a light source 41 and a printed circuit board 42 and various optical members disposed on a path of light emitted from the light source 41.

A light emitting diode (LED), a cold cathode fluorescent lamp (CCFL), an external electrode fluorescent lamp (EEFL), or the like may be used as the light source 41.

A circuit pattern or the like for transmitting driving power and signals to the light source 41 may be formed on the printed circuit board 42. The printed circuit board 42 may include a base part 43 formed substantially in parallel with the light guide plate 20 and an extension part 46 extending forward from the base part 43. The light source 41 may be mounted on the extension part 46.

When the light source 41 is a point light source, a plurality of light sources 41 may be arranged at regular intervals along the edge of the display panel 10. The plurality of point light sources may emit light toward an incident surface 21 of a light guide plate 20. Light emitted from the plurality of point light sources may be converted to plane light through the light guide plate 20 and may advance toward the display panel 10.

According to an embodiment of the present invention, the light source module 40 may be disposed adjacent to the short sides 13 and 14 of the display panel 10. The arrangement of the light source module 40 is not limited to this embodiment, but the light source module 40 may be disposed on the long sides 11 and 12, on all the long and short sides 11, 12, 13, and 14, or on one of those sides.

In addition, the light source module 40 may include a contact protrusion 49 provided to contact the light guide plate 20. The contact protrusion 49 may be integrally formed with the printed circuit board 42 or may be separately provided and coupled to the printed circuit board 42. The force generated when the light guide plate 20 expands may be transmitted to the light source module 40 through the contact protrusion 49 and the light source module 40 may be moved.

The display apparatus 1 also includes an elastic member 60 to elastically support the light source module 40. When the light guide plate 20 contracts to its original shape, the light source module 40 is also restored to its original position by the elastic member 60.

In this embodiment, the elastic member 60 is formed of a rubber material and may have a rod shape formed along the short sides 13 and 14 of the display panel 10. One end of the elastic member 60 may be supported on the printed circuit board 42 and the other end may be supported on a side part 86 of a middle mold 85. One end of the elastic member 60 may be adhered to the printed circuit board 42 and the other end may be adhered to the side part 86 of the middle mold 85.

However, unlike the present embodiment, the other end of the elastic member 60 may be configured to be adhered to and supported by the bottom chassis 90 rather than the middle mold 85.

With this structure, when the light guide plate 20 expands or contracts, the light source module 40 moves in the direction of expansion or contraction of the light guide plate 20, so that the gap between the light guide plate 20 and the light source 41 may be kept constant. Therefore, the safety gap between the light guide plate 20 and the light source 41 against the expansion of the light guide plate 20 may be minimized. As a result, the brightness of the display panel 10 may be improved.

The optical member may be disposed on the path of the light emitted from the light source 41. The optical member may include a reflective sheet 25 to reflect light and prevent light loss, a light guide plate 20 to uniformly disperse the light emitted from the light source 41 toward the display panel 10, a quantum dot sheet 18, and an optical sheet 15 to improve optical characteristics.

The reflective sheet 25 may be disposed on the rear surface of the light guide plate 20 so that light emitted from the light source 41 is incident on the light guide plate 20 or light emitted from the light guide plate 20 is incident on the light guide plate 20 again.

The light guide plate 20 may be made of PMMA (Poly Methyl Methacrylate Acrylate). The light guide plate 20 may be formed with various patterns to change the light path.

Quantum dot sheet 18 may improve the color reproducibility by changing the wavelength of light. Quantum dots, which are semiconductor crystals having a size of several nanometers and emitting light may be distributed inside the Quantum dot sheet 18. The quantum dot is capable of generating all the colors of light of various wavelengths, that is, visible light, by receiving blue light.

The optical sheet 15 may include a diffusion sheet 17 to cancel the influence of the pattern of the light guide plate 20 and a prism sheet 16 to enhance brightness by concentrating light.

The display apparatus 1 may include the display panel 10 and a chassis assembly to receive and support the backlight unit. The chassis assembly may include a top chassis 80, a middle mold 85, and a bottom chassis 90.

The top chassis 80 may be provided in a rectangular frame shape on the front surface of the display apparatus 1 and may include a panel supporting part 81 to support the display panel 10 and a bezel part 82 to form a bezel. The display panel 10 may be attached to the panel supporting part 81.

The middle mold 85 may be coupled to the rear of the top chassis 80. The middle mold 85 has a side part 86 provided in a rectangular frame shape and an middle support part 87 protruding from the side part 86 to support the light guide plate 20 and the optical sheet 15 and maintain the gap.

The bottom chassis 90 may have a substantial plate shape and may be coupled to the rear of the middle mold 85. The bottom chassis 90 may be formed of a metal material such as aluminum, SUS or the like or a plastic material such as ABS, which has good thermal conductivity to dissipate heat generated from the light source 41 to the outside. At the rear of the bottom chassis 90, a cover member 2, which forms the rear exterior of the display apparatus 1, may be coupled.

In another embodiment, one of the top chassis 80, the middle mold 85, and the bottom chassis 90 may be omitted or integrally formed with another.

The display apparatus 1 may include a graphite sheet 70 and a heat sink 75 disposed between the printed circuit board 42 and the bottom chassis 90 so as to dissipate heat from the light source module 40. The graphite sheet 70 may be formed of a graphite material. The heat sink 75 may be made of aluminum and may be closely disposed between the graphite sheet 70 and the bottom chassis 90.

As described above, according to the embodiment of the present disclosure, the light source module 40 is movable in accordance with the expansion and contraction of the light guide plate 20. The display apparatus 1 may include a guide member 50 to guide the movement of the light source module 40 smoothly and accurately.

The guide member 50 may guide the light source module 40 to move in the X direction which is parallel to the long sides 11 and 12 of the display panel 10 (left and right direction of the display apparatus 1) as the light guide plate 20 expands and contracts. Conversely, the guide member 50 may restrict the movement of the light source module 40 in the Y direction, which is the direction parallel to the short sides 13 and 14 (up and down direction of the display apparatus 1), or the Z direction, which is the direction orthogonal to the X direction and the Y direction (front and back direction of the display apparatus 1).

The guide member 50 may include a head part 51 to restrict the movement of the light source module 40 in the Z direction and a neck part 52 to guide the movement of the light source module 40 in the X direction and restrict movement in the Y direction.

The head part 51 may have a flat shape parallel to the base part 43 of the printed circuit board 42. The head part 51 protrudes forward from the front surface 44 of the printed circuit board 42 and may be brought into close contact with the front surface 44 of the printed circuit board 42. Therefore, the head part 51 may restrict the movement of the printed circuit board 42 in the Z direction.

The neck part 52 may be formed to extend rearward from the head part 51. The neck part 52 may be formed in a conical shape whose diameter decreases toward the rear side. A guide hole 45 may be formed in the printed circuit board 42 and the neck part 52 may be disposed in the guide hole 45. Due to the conical shape of the neck part 52, the neck part 52 may be smoothly inserted into the guide hole 45.

The length XL2 of the guide hole 45 in the X direction may be larger than the length XL1 of the neck part 52 in the X direction (see FIG. 5). On the other hand, the length YL2 in the Y direction of the guide hole 45 may substantially correspond to the maximum length YL2 of the neck part 52 in the Y direction (see FIG. 6). Therefore, the neck part 52 guides the light source module 40 to move in the X direction, and may prevent the light source module 40 from moving in the Y direction.

The bottom chassis 90 is formed with a bottom chassis engagement hole 91 and the guide member 50 may include a hook part 54 to couple the guide member 50 to the bottom chassis engagement hole 90. The hook part 54 may be provided to be elastically deformable between a widened first shape (see FIG. 6) and a narrowed second shape (FIG. 7). The hook part 54 may maintain the first shape when no external force is applied.

The hook part 54 includes an inner support 55 supported on the inner circumferential surface of the bottom chassis engagement hole 91 so as to restrain the guide member 50 from moving in the X and Y directions with respect to the bottom chassis 90, and an outer support 56 that is supported on the rear surface 93 of the bottom chassis 90 to restrain the member 50 from moving in the Z direction relative to the bottom chassis 90.

Specifically, the outer support 56 of the hook part 54 may restrain the guide member 50 from moving forward in the Z direction, and the head part 51 may prevent the guide member 50 from moving rearward in the Z direction.

However, as described above, the hook part 54 may be elastically deformed, and when the hook part 54 is deformed into the second shape of FIG. 7, the guide member 50 may be detached from the bottom chassis 90. Conversely, when the guide member 50 is to be mounted, the hook portion 54 may pass through the guide hole 45 and the bottom chassis engagement hole 91 by being deformed into the second shape. After the hook portion 54 passes through the guide hole 45 and the bottom chassis engagement hole 91, the hook part 54 is restored to the first shape and the guide member 50 may be fixed.

A sheet through hole 71 and heat sink through holes 76 may be formed in the above-described graphite sheet 70 and the heat sink 75, respectively, so that the guide member 50 may pass through them.

The guide member 50 may include a body part 53 connecting the neck part 52 and the hook part 54.

The head part 51 of the guide member 50 is formed to protrude forward from the front surface 44 of the printed circuit board 42. Therefore, a height difference (a step) is made between an area where the guide member 50 is disposed and an area where the guide member 50 is not disposed. This step damages the flatness of the light guide plate 20 and the reflective sheet 25 disposed on the front side of the printed circuit board 42. Therefore the display apparatus 1 according to an embodiment of the present invention may include a spacer member 30 attached to the front surface 44 of the printed circuit board 42 to compensate for the thickness of the head part 51.

The spacer member 30 may have thickness D2 corresponding to or greater than the thickness D1 of the head part 51 so that the flatness of the light guide plate 20 and the reflective sheet 25 disposed in front of the spacer member 30 is not damaged. The spacer member 30 may be formed with a spacer through hole 31 in which the head part 51 of the guide member 50 is disposed. The spacer member 30 may be attached to the front surface 43 of the printed circuit board 42 by an adhesive member.

As shown in FIG. 8, a lubricant layer 72 may be provided on the front surface of the graphite sheet 70 so that the frictional force with the printed circuit board 42 is reduced when the light source module 40 moves. The lubricant layer 72 may be formed of a material having a low friction coefficient, for example, a PET material.

As described above, according to the embodiment of the present disclosure, when the light guide plate 20 thermally expands or contracts, the light source module 40 is movable while maintaining the gap with the light guide plate 20. Accordingly, the gap between the light source 40 and the light guide plate 20 may be minimized to improve the brightness of the display panel 10.

Further, the movement of the light source module 40 may be smoothly and accurately guided through the guide member 50. Since the guide member 50 is installed on the bottom chassis 90 by means of elastic force and a fitting structure, there is no need for a separate tool when the guide member 50 is installed and it is easy to install and separate the guide member 50.

Figure 12:
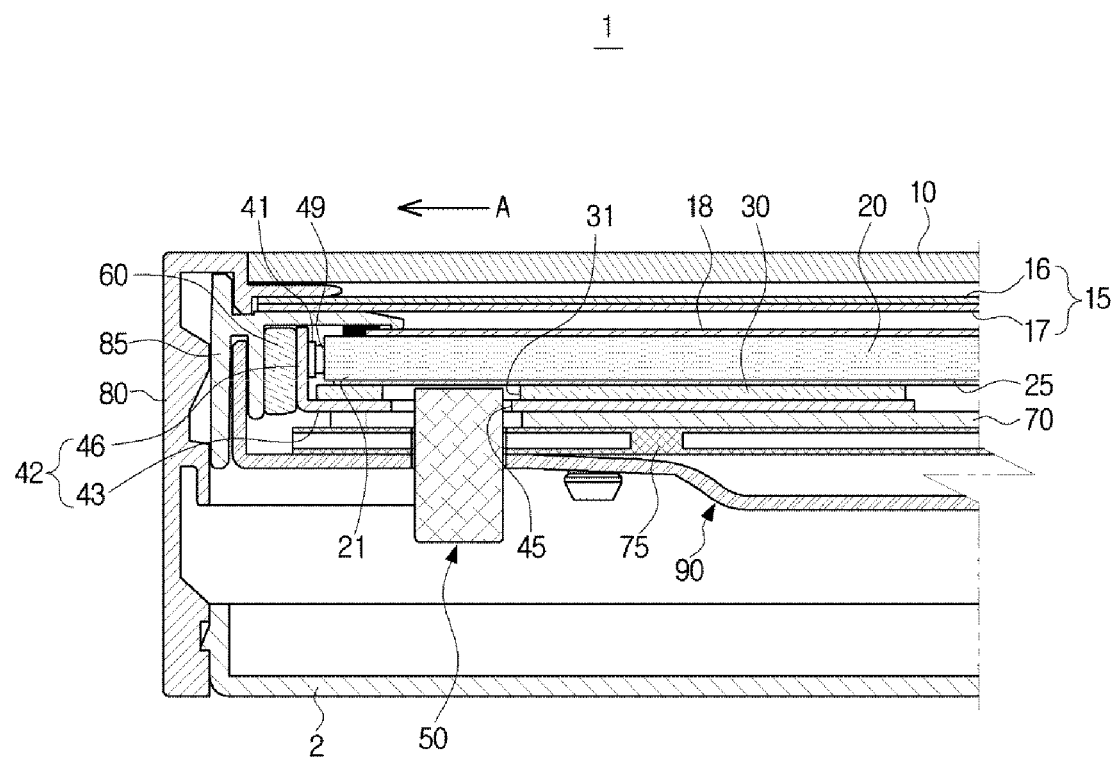
FIG. 12 is a cross-sectional view showing movement of the light source module when the light guide plate of the display apparatus of FIG. 1 expands.
Figure 13:
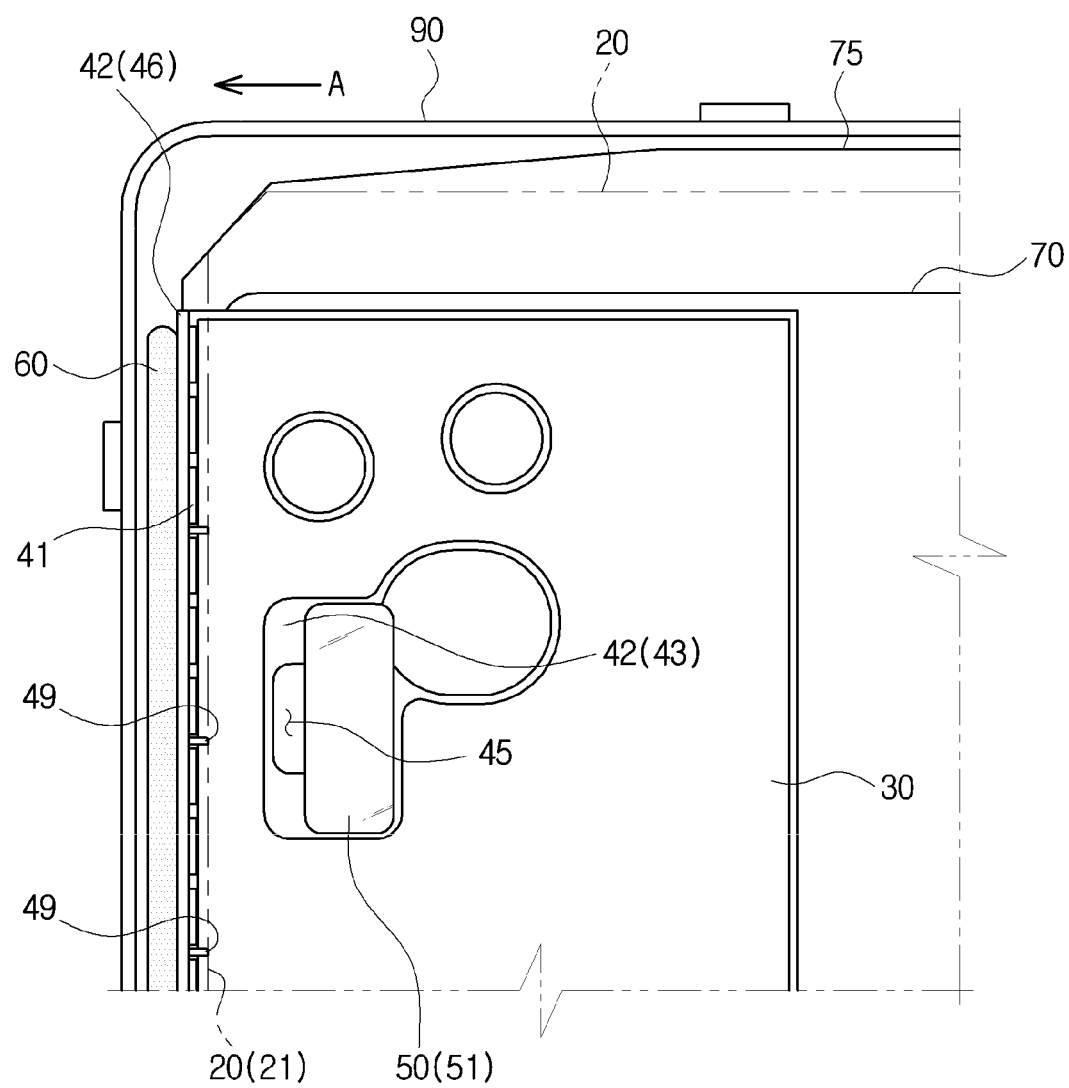
FIG. 13 is a plan view showing an operation in which the light source module moves when the light guide plate of the display apparatus of FIG. 1 expands.

FIG. 12 is a cross-sectional view showing the movement of the light source module when the light guide plate of the display apparatus of FIG. 1 expands. FIG. 13 is a plan view showing an operation in which the light source module moves when the light guide plate of the display apparatus of FIG. 1 expands.

Referring to FIGS. 12 to 13, the operation of the light source module when the light guide plate of the display apparatus according to the embodiment of the present disclosure expands will be briefly described.

The light source module 40 is arranged adjacent to the short sides 13 and 14 of the display panel 10. When the light guide plate 20 thermally expands, Pushing force A is transmitted to the light source module 40 through the contact protrusion 49 contacting the light guide plate 20, and the light source module 40 is pushed outward. At this time, elastic force is accumulated in the elastic member 60 provided between the printed circuit board 42 and the middle mold 85.

The guide member 50 provided in the bottom chassis 90 guides the light source module 40 to move in the X direction and not to move in the Y direction and the Z direction so that the light source module 40 may move smoothly and accurately.

When the light guide plate 20 contracts, the light source module 40 may return to the original position by the elastic force of the elastic member 60.

Figure 14:
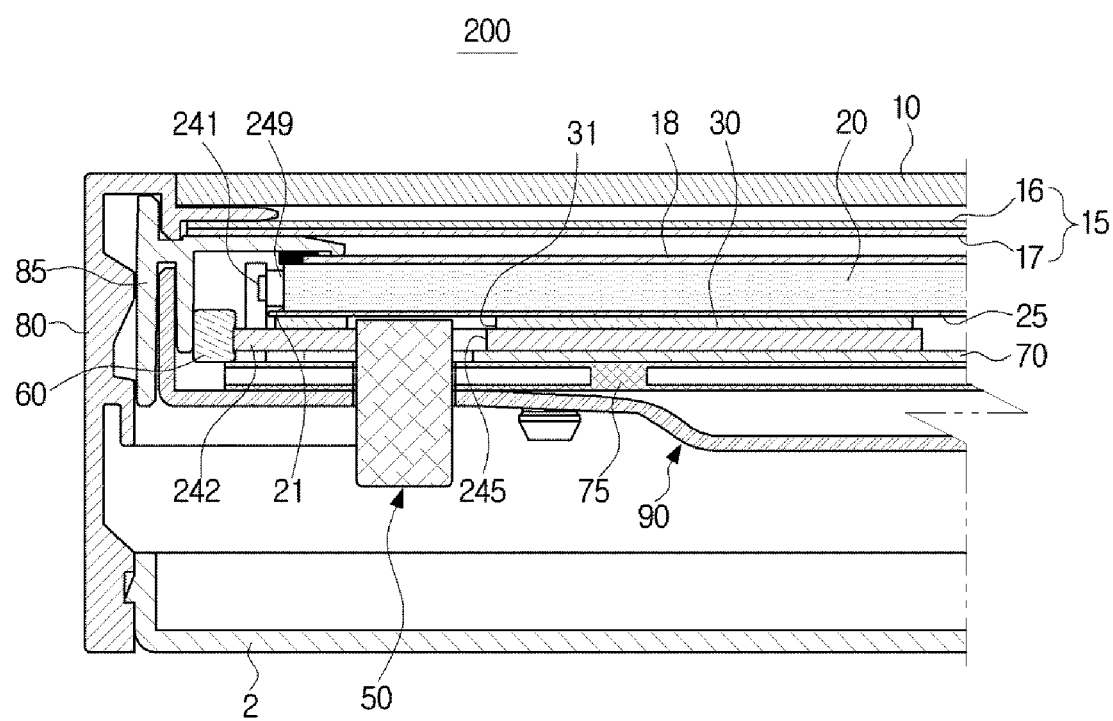
FIG. 14 illustrates a light source module and peripheral structure according to an embodiment of the present disclosure.

FIG. 14 illustrates a light source module and a peripheral structure according to an embodiment of the present disclosure.

The same reference numerals are assigned to the same components as those in the above-described embodiment, and description thereof may be omitted.

A display apparatus 200 may include a printed circuit board 240 having a simple flat shape. At this time, a light source 241 may be vertically mounted on the printed circuit board 240 to emit light toward the incident surface 21 of the light guide plate 20. A guide hole 245 may be formed in the printed circuit board 240 to allow the guide member 50 to pass the guide hole 245. The light source module 40 may include a contact protrusion 249 provided to contact the light guide plate 20.

Figure 15:
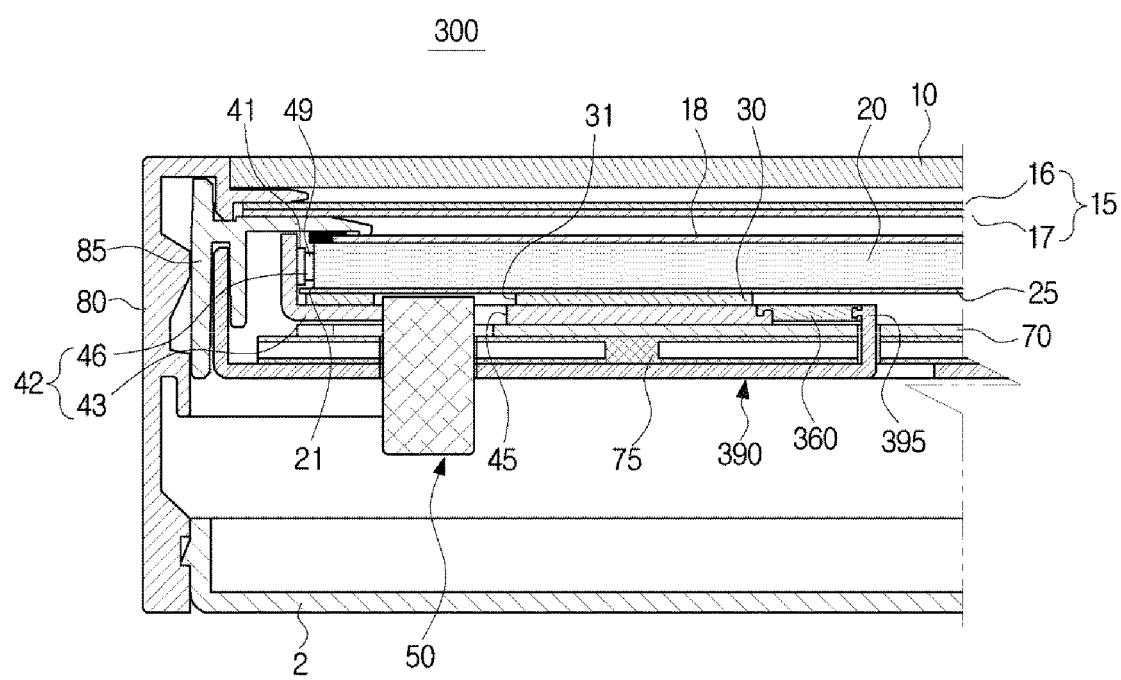
FIG. 15 shows an elastic member and peripheral structure according to an embodiment of the present disclosure.

FIG. 15 is a view showing an elastic member and a peripheral structure according to an embodiment of the present disclosure.

The same reference numerals are assigned to the same components as those in the above-described embodiment, and description thereof may be omitted.

A display apparatus 300 may include an elastic member 360 configured to expand as the light guide plate 20 expands. One end of the elastic member 360 may be coupled to the printed circuit board 42 and the other end may be coupled to the elastic member support 395 of the bottom chassis 390. When the light guide plate 20 expands, the elastic member 360 also expands and accumulates the elastic force. When the light guide plate 20 contracts, the elastic member 360 also contracts by the elastic force, so that the elastic member 360 may pull the printed circuit board 42. The elastic member 360 may be formed of a rubber material or may be a tension spring.

Figure 16:
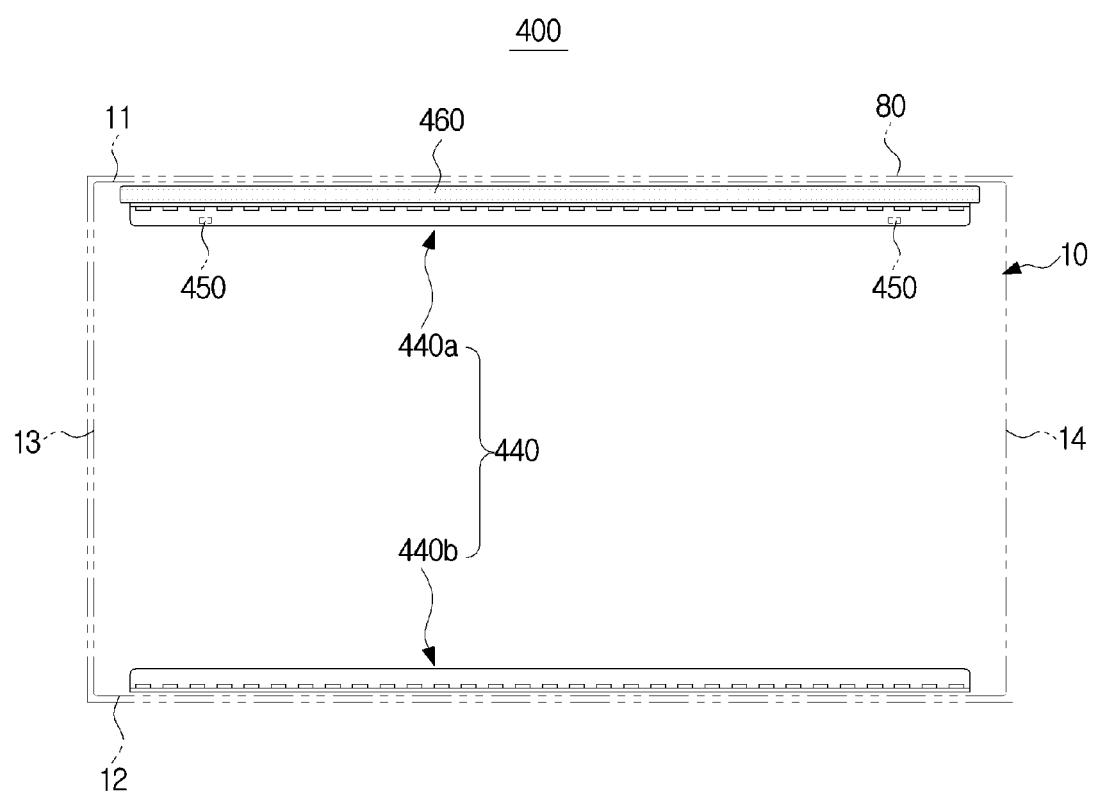
FIG. 16 shows the arrangement of a light source module and a guide member, according to an embodiment of the present disclosure.

FIG. 16 is a view showing the arrangement of a light source module and a guide member according to an embodiment of the present disclosure.

The same reference numerals are assigned to the same components as those in the above-described embodiment, and description thereof may be omitted.

A light source module 440 may be disposed adjacent to the long sides 11 and 12 of the display panel 10. The light source module 440 may include a first light source module 440a disposed adjacent to the first long side 11 on the top and a second light source module 440b disposed adjacent to the second long side 12 on the bottom.

A display apparatus 400 may include a guide member 460 to guide the movement of the first light source module 440a in accordance with the expansion and contraction of the light guide plate. That is, the guide member 460 may be provided only on the first long side 11 of the top and not on the second long side 12 side of the bottom.

This is because the light guide plate leans downward by its own weight in a state where the display apparatus 400 is installed, so that even when the light guide plate expands, the light guide plate exerts force on the upper first light source module 440a.

The guide member 460 guides the first light source module 440a to move in the Y direction which is parallel to the short sides 13 and 14 (up and down direction of the display apparatus 400). The guide member 460 may restrict the movement of the first light source module 440a in the X direction parallel to the long sides 11 and 12 (left and right direction of the display apparatus 400) and in the Z direction orthogonal to the X direction and the Y direction (front and back direction of the display apparatus 400).

Although the technical idea of the present disclosure has been described with reference to specific embodiments, the scope of rights of the present invention is not limited to these embodiments. It is to be understood that the invention is not limited to the disclosed embodiments, but, on the contrary, is intended to cover various modifications and equivalent arrangements included within the spirit and scope of the appended claims.

The invention claimed is:

1. A display module comprising:
a display panel having a long side and a short side;
a light source module having a printed circuit board and a light source mounted on the printed circuit board, and installed adjacent to at least one of a long side and a short side of the display panel;
a light guide plate guiding the light emitted from the light source to the display panel;
a bottom chassis disposed behind the light guide plate;
a guide member including a head part supporting a front surface of the printed circuit board to guide the light source module to move in a direction parallel to one of the long side and the short side where the light source module is installed and prevent the light source module from moving in a Z direction orthogonal to the long side and the short side as the light guide plate expands or contracts; and
a spacer member attached to the front surface of the printed circuit board to compensate for a thickness of the head part and having a thickness equal to or greater than a thickness of the head part.

2. The display module according to claim 1, wherein the spacer member is formed with a spacer hole allowing the guide member to pass therethrough.

3. The display module according to claim 1, wherein the light source module is installed adjacent to the short side of the display panel, and the guide member guides the light source module to move in an X direction parallel to the long side and prevents the light source module from moving in a Y direction parallel to the short side.

4. The display module according to claim 3, wherein a guide hole is formed in the printed circuit board, and the guide member includes a neck part disposed in the guide hole,
the length of the guide hole in the X direction is larger than the length of the neck part in the X direction, and
the length of the guide hole in the Y direction corresponds to the length of the neck part in the Y direction.

5. The display module according to claim 1, wherein a bottom chassis engagement hole is formed in the bottom chassis so that the guide member is coupled to the bottom chassis, and
the guide member includes a hook part that is elastically deformed between a first shape in which the hook part is widened to be supported on a rear surface of the bottom chassis and a second shape in which the hook part is narrowed to pass through the bottom chassis engagement hole.

6. The display module according to claim 5, wherein the hook part comprises an inner support supported by an inner surface of the bottom chassis engagement hole to prevent the guide member from moving in the X direction parallel to the long side and in the Y direction parallel to the short side.

7. The display module according to claim 6, wherein the hook part comprises an outer support supported on a rear surface of the bottom chassis to restrain the guide member from moving in the Z direction with respect to the bottom chassis.

8. The display module according to claim 1, further comprising an elastic member configured to elastically support the light source module and a middle mold coupled to a front edge of the bottom chassis,
wherein one end of the elastic member is supported by the printed circuit board and the other end is supported by the bottom chassis or the middle mold.

9. The display module according to claim 8, wherein the elastic member is formed of a rubber material and has a rod shape along the side where the light source module is installed.

10. The display module according to claim 8, wherein one end of the elastic member is bonded to the printed circuit board and the other end is bonded to the bottom chassis or the middle mold.

11. The display module according to claim 8, wherein the printed circuit board comprises a base part arranged in parallel with the light guide plate, and an extension part extending forward from the base part and having the light source mounted thereon, and
the elastic member is supported by the extension part.

12. The display module according to claim 1, further comprising a graphite sheet disposed between the light source module and the bottom chassis so as to dissipate heat from the light source module,
wherein a lubricant layer is provided on a front surface of the graphite sheet so that the frictional force is reduced when the light source module moves.

13. The display module according to claim 1, further comprising a graphite sheet disposed between the light source module and the bottom chassis so as to dissipate heat from the light source module,
wherein the graphite sheet is formed with a sheet through hole allowing the guide member to pass therethrough.

14. The display module according to claim 1, further comprising a heat sink disposed between the light source module and the bottom chassis to dissipate heat from the light source module,
wherein the heat sink is formed with a heat sink through hole allowing the guide member to pass therethrough.

15. The display module according to claim 1, wherein the light source module is installed adjacent to the long side of the display panel, and
the guide member guides the light source module to move in the Y direction parallel to the short side and prevents the light source module from moving in the X direction parallel to the long side.

* * * * *